United States Patent
Bian (10) Patent No.: US 12,113,546 B2
(45) Date of Patent: Oct. 8, 2024

(54) DATA PROCESSING METHOD AND DEVICE, DECODER, NETWORK DEVICE AND STORAGE MEDIUM

(71) Applicant: SANECHIPS TECHNOLOGY CO., LTD, Guangdong (CN)

(72) Inventor: Qing Bian, Guangdong (CN)

(73) Assignee: SANECHIPS TECHNOLOGY CO., LTD., Guangdong (CN)

( * ) Notice: Subject to any disclaimer, the term of this patent is extended or adjusted under 35 U.S.C. 154(b) by 124 days.

(21) Appl. No.: 18/021,037

(22) PCT Filed: Aug. 4, 2021

(86) PCT No.: PCT/CN2021/110549
§ 371 (c)(1),
(2) Date: Feb. 13, 2023

(87) PCT Pub. No.: WO2022/033370
PCT Pub. Date: Feb. 17, 2022

(65) Prior Publication Data
US 2023/0299790 A1    Sep. 21, 2023

(30) Foreign Application Priority Data
Aug. 14, 2020 (CN) .......................... 202010822621.3

(51) Int. Cl.
*H03M 13/11* (2006.01)
(52) U.S. Cl.
CPC .... *H03M 13/1125* (2013.01); *H03M 13/1151* (2013.01)

(58) Field of Classification Search
CPC ................................................ H03M 13/1125
See application file for complete search history.

(56) References Cited

U.S. PATENT DOCUMENTS 8,190,962 B1  5/2012  Chen et al.
8,472,568 B1  6/2013  Fattal et al.
(Continued)

FOREIGN PATENT DOCUMENTS

EP       3588821 A1      1/2020
JP     2008153751 A      7/2008
(Continued)

OTHER PUBLICATIONS

European Patent Office, extended European Search Report dated Jun. 24, 2024, for corresponding EP application No. 21855423.6.
(Continued)

*Primary Examiner* — Joseph D Torres
(74) *Attorney, Agent, or Firm* — Li & Cai Intellectual Property (USA) Office (57) ABSTRACT

A data processing method for use in a data processing device, a decoder, a network device and/or a computer-readable storage medium. The data processing method includes: classifying log likelihood ratio (LLR) elements according to a modulation mode, a preset decoder quantization threshold and a signal-to-noise ratio, to obtain a classification result; extracting feature information of each category in the classification result; calculating to obtain a scale factor according to the feature information of each category; and scaling the LLR elements according to the scale factor.

12 Claims, 5 Drawing Sheets

(56) References Cited

U.S. PATENT DOCUMENTS

| | | | |
|---|---|---|---|
| 10,341,053 | B2 | 7/2019 | Ahirwar et al. |
| 2007/0086541 | A1 | 4/2007 | Moon et al. |
| 2008/0279299 | A1* | 11/2008 | Reuven ............. H04L 25/03318 375/267 |
| 2009/0245433 | A1* | 10/2009 | Challa .................. H04L 25/067 375/341 |
| 2013/0051444 | A1* | 2/2013 | Roh ................. H03M 13/6591 714/780 |
| 2019/0222225 | A1 | 7/2019 | Hirwar et al. |
| 2020/0235758 | A1 | 7/2020 | Khude et al. |

FOREIGN PATENT DOCUMENTS

| | | |
|---|---|---|
| JP | 2010158015 A | 7/2010 |
| JP | 2011159360 A | 8/2011 |
| JP | 2013115542 A | 6/2013 |
| KR | 20070042223 A | 4/2007 |

OTHER PUBLICATIONS

Korean Patent Office, first Office action dated Mar. 4, 2024, for corresponding KR application No. 10-2022-7043480.
Japan Patent Office, first Office action dated Feb. 20, 2024, for corresponding JP application No. 2022-574835.
Wu, et al., "BICM Performance Improvement via Online LLR Optimization", 2013 IEEE Wireless Communications and Networking Conference, Apr. 10, 2013.

* cited by examiner

DATA PROCESSING METHOD AND DEVICE, DECODER, NETWORK DEVICE AND STORAGE MEDIUM

CROSS-REFERENCE TO RELATED APPLICATIONS

The present application claims priority from Chinese patent application No. 202010822621.3 filed on Aug. 14, 2020, the disclosures of which are hereby incorporated by reference in their entireties.

TECHNICAL FIELD

The present application relates to the field of communication technology, and in particular, relates to a data processing method, a data processing device, a decoder, a network device and a computer-readable storage medium.

BACKGROUND

In the 5th Generation Mobile Networks (5G), a low density parity check code (LDPC) encoding/decoding technique is used on a physical data transmission channel to achieve high-quality information transmission. Typical LDPC decoding algorithms include hard-decision decoding algorithms and soft-decision decoding algorithms. The hard-decision decoding algorithm has low computational complexity, but the decoding performance thereof is not ideal, and decoding errors often occur. One of commonly used soft-decision decoding algorithms is a back propagation (BP) algorithm, the basic idea of which is to apply a bipartite graph to a log likelihood ratio (LLR) of input bits to be decoded and perform iterative propagation of information between a check node and a variable node. Meanwhile, considering a balance between complexity and performance, it is desired to perform fixed-point transformation on the input LLR elements, and quantize the LLR elements using specific bits.

However, the soft-decision decoding algorithm is too complex to implement, and cannot be well applied to actual communication systems. Further, the use of the fixed-point transformation reduces complexity of implementation of the soft-decision decoding algorithm, but introduces quantization errors, which makes the decoding algorithm unable to adapt to the complex fading channel environment in a 5G communication network and requirements on performances of the LDPC decoder under different modulation modes.

SUMMARY

The present application provides a data processing method, including: classifying log likelihood ratio (LLR) elements according to a modulation mode, a preset decoder quantization threshold and a signal-to-noise ratio, to obtain a classification result; extracting feature information of each category in the classification result; calculating to obtain a scale factor according to the feature information of each category; and scaling the LLR elements according to the scale factor.

The present application provides a data processing device, including: a classification module configured to classify log likelihood ratio (LLR) elements according to a modulation mode, a preset decoder quantization threshold and a signal-to-noise ratio, to obtain a classification result; an extraction module configured to extract feature information of each category in the classification result; a calculation module configured to calculate to obtain a scale factor according to the feature information of each category; and a scaling module configured to scale the LLR elements according to the scale factor.

The present application provides a decoder, including: a data processing device configured to perform the data processing method according to the present application to generate scaled LLR elements; a quantization device configured to perform saturation quantization processing on the scaled LLR elements output from the data processing device to generate quantized LLR elements, and obtain a quantized LLR array based on the quantized LLR elements; and a decoding device configured to perform low density parity check code decoding on the quantized LLR array.

The present application provides a network device, including: at least one processor; a memory having at least one program stored thereon, the at least one program, when executed by the at least one processor, causes the at least one processor to implement the data processing method according to the present application.

The present application provides a computer-readable storage medium having a computer program stored thereon, the computer program, when executed by a processor, causes the processor to implement the data processing method according to the present application.

With respect to the above and other aspects of the present application, further description is provided with reference to the accompanying drawings.

DETAILED DESCRIPTION

In order to make objects, technical solutions and advantages of the present application clear, implementations of the present application will be described in detail in conjunction with the accompanying drawings. It should be noted that the implementations of the present application and features therein may be combined with each other in any manner, as long as they are not contradictory.

In order to prevent the procedure of quantizing LLR elements in an input LLR array from causing performance loss in LDPC decoding, values of the input floating-point LLR elements are generally scaled to obtain scaled LLR elements, and then the scaled LLR elements are quantized. In current data scaling methods, a scale factor is mainly adjusted based on a number of iterations of LDPC, an SNR (signal-to-noise ratio) of the input signal, and other information related to confidence, and multiplying the input LLR elements by the scale factor to obtain scaled LLR elements. Such data scaling methods can reduce the performance loss in LDPC decoding caused by data quantization to a certain extent, but cannot be well applied to actual communication systems or cannot be adapt to the complex fading channel environment in a 5G communication network and requirements on performance of the LDPC decoder under different modulation modes.

Figure 1:
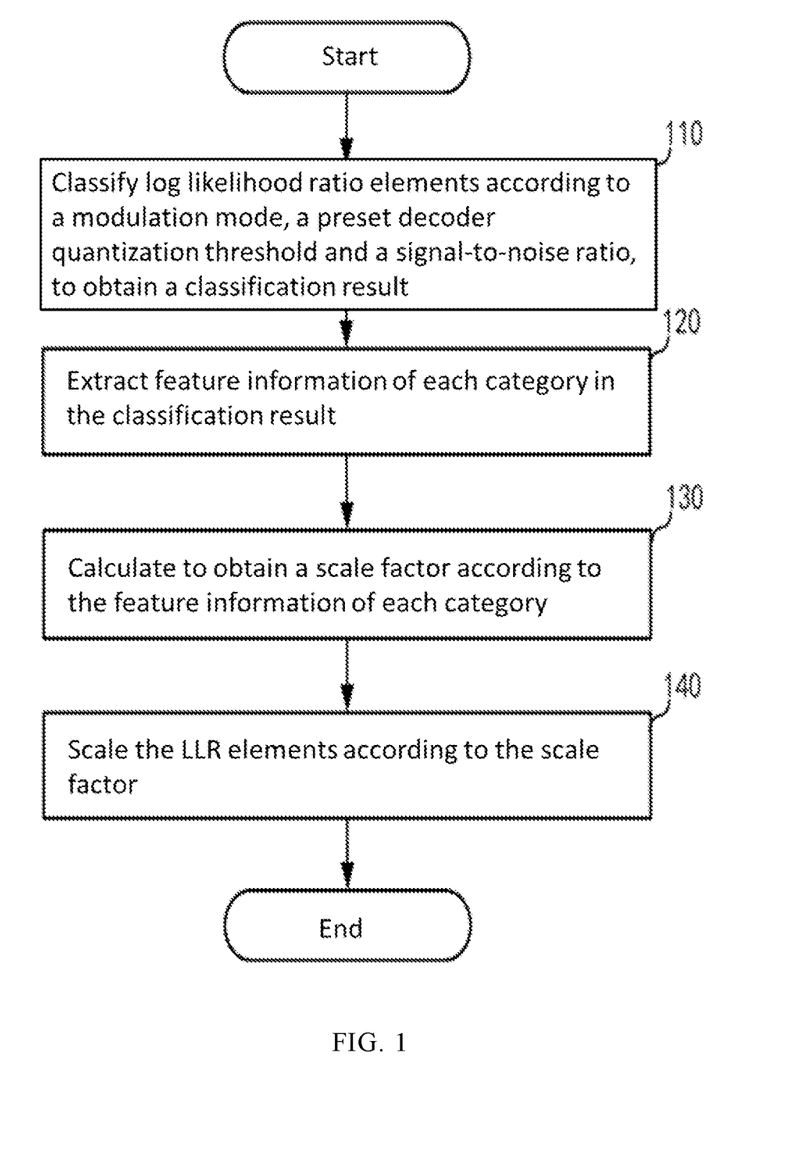
FIG. 1 is a flowchart of a data processing method according to the present application.

FIG. 1 shows a schematic flowchart of a data processing method according to the present application. The data processing method may be applied to a data processing device that may be disposed in a decoder. As shown in FIG. 1, the data processing method according to the present application includes the following operations 110 to 140.

At operation 110, classifying log likelihood ratio elements according to a modulation mode, a preset decoder quantization threshold and a signal-to-noise ratio, to obtain a classification result.

The log likelihood ratio (LLR) is a ratio of prior probability of a symbol value commonly used in communications for soft decoding. Under certain conditions (for example, in a case where a symbol takes values with equal probabilities and the channel has no memory), the LLR may be converted into a ratio of posterior probability.

In some implementations, the operation 110 is implemented by: generating a classification threshold according to the modulation mode, the preset decoder quantization threshold and the signal-to-noise ratio; determining a category corresponding to each LLR element according to the classification threshold and a value of the LLR element; and obtaining the classification result based on the category corresponding to each LLR element.

It should be noted that the modulation mode may include a quadrature phase shift keying (QPSK) modulation mode, a quadrature amplitude modulation (QAM) mode of different bases, such as 16QAM, 64QAM and 256QAM. The above modulation modes are merely examples, and other modulation modes not described herein are also within the protection scope of the present application and may be specifically set according to specific situations, and thus are not repeated here.

The preset decoder quantization threshold is a value determined according to a quantization range of a low density parity check code (LDPC) decoder. For example, if the quantization range of the LDPC decoder is [−a, b], where a and b are both numbers greater than zero, then the preset decoder quantization threshold takes a maximum value of a and b, that is, the preset decoder quantization threshold $q_{abs}$=max(a, b). For example, if [−a, b]=[−8.0, 7.75], then $q_{abs}$=8.

The signal-to-noise ratio (SNR) refers to a ratio of signal to noise in an electronic system/device. The "signal" here refers to an electronic signal, from outside, to be processed by the device, and the "noise" refers to a random additional signal (or information) that is generated through the device, is not present in the original signal, and does not change with the original signal. The SNR in a narrow sense represents a ratio of a signal power to a noise power output from an amplifier simultaneously, and is generally expressed in decibels (dB). The larger the signal-to-noise ratio of the device, the less noise is generated by the device, and the higher the quality of sound that is played by the device is; otherwise, the less the signal-to-noise ratio of the device, the more noise is generated by the device, and the lower the quality of sound that is played by the device is. The classification threshold may include multiple different thresholds to enable the LLR elements in the input LLR array to be divided into a plurality of categories. That is, the classification result may include a plurality of categories each including multiple LLR elements. By balancing values of the LLR elements in different categories, the LLR elements with larger values can be filtered out so as to avoid too many saturated quantized values exist after quantizing the LLR elements to lead to an inaccurate decoded result, and thus an accuracy of decoding is improved.

For example, the classification threshold $Th_{LLR}=Factor_{qam}*Factor_{SNR}*q_{abs}$, where $q_{abs}$ represents the preset decoder quantization threshold, $Factor_{qam}$ represents a classification threshold calculation factor corresponding to the modulation mode, and $Factor_{SNR}$ represents a classification threshold calculation factor corresponding to the signal-to-noise ratio. For example, if the modulation mode is 256QAM, the calculation factor corresponding to the modulation mode is 4.0, and the SNR is 30 dB, and in such case, the calculation factor corresponding to the SNR is 0.9, and the preset decoder quantization threshold is set to be 8, then the classification threshold $Th_{LLR}=4.0\times0.9\times8.0=28.8$.

At operation 120, extracting feature information of each category in the classification result.

The feature information of each category may include the number of the LLR elements in the category, values of the LLR elements in the category, an LLR mean value corresponding to the category, or other various information. The above feature information of the category is merely an example, and other types of feature information of the category not described herein are also within the protection scope of the present application and may be specifically set according to specific situations, and thus are not repeated here.

In some implementations, the operation 120 may be implemented by performing following operations on each category in the classification result: counting the number of the LLR elements in each category to obtain a number statistical result corresponding to each category; accumulating values of the LLR elements in each category to generate a numerical value statistical result corresponding to each category; calculating and generating an LLR mean value corresponding to each category according to the numerical value statistical result corresponding to each category and the number statistical result corresponding to each category; and determining the feature information of each category according to the number statistical result corresponding to each category, the numerical value statistical result corresponding to each category, and the LLR mean value corresponding to each category.

For example, the LLR elements in the LLR array are classified according to the classification threshold $Th_{LLR}$=28.8, and the obtained classification result includes two categories, i.e., a first category and a second category. The value of each LLR element in the first category is greater than or equal to 28.8, the first category includes M LLR elements, the value of each LLR element in the second category is less than 28.8, the second category includes N LLR elements, and M and N are both integers greater than or equal to 1. The number statistical result corresponding to the first category is M, and the number statistical result corresponding to the second category is N. Values of the LLR elements in the first category are accumulated to generate a numerical value statistical result $sum_h$, and then, the LLR mean value corresponding to the first category is equal to $sum_h \div M$. Likewise, values of the LLR elements in the second category are accumulated to generate a numerical value statistical result $sum_l$, and then, the LLR mean value corresponding to the second category is equal to $sum_l \div N$.

The number statistical result corresponding to each category, the numerical value statistical result corresponding to each category and the LLR mean value corresponding to each category are obtained through calculation, and then the scale factor is facilitated to be calculated later based on such feature information, and is ensured to be more consistent with features of each category, so that the values of the LLR elements in different categories can be balanced.

At operation 130, calculating to obtain a scale factor according to the feature information of each category.

It should be noted that the scale factor is used for scaling the LLR elements to improve encoding/decoding performance of the channel, thereby ensuring reliable transmission of the channel. By calculating the scale factor using the feature information of each category, feature information of the LLR elements in each category can be balanced, thereby ensuring the scale factor to be more reasonable.

In some implementations, the operation 130 may be implemented by: determining a proportion of each category according to the number statistical result; determining a weight of each category according to the proportion of each category and a preset proportion threshold; and calculating to obtain the scale factor according to the weight of each category, the LLR mean value corresponding to each category and a preset target value, where the preset target value is a value determined according to the preset decoder quantization threshold and the modulation mode.

For example, the preset target value $LLR_{target} = q_{abs} * Factor_{target}$, where $Factor_{target}$ represents a calculation factor corresponding to the modulation mode.

In some implementations, the determining a weight of each category according to the proportion of each category and a preset proportion threshold includes: determining, in response to that the classification result includes a first category and a second category, the first category has a proportion greater than a first preset proportion threshold and less than a second preset proportion threshold, a value of each LLR element in the first category is less than a preset element threshold, and a value of each LLR element in the second category is greater than the preset element threshold, that the first category has a greater weight than the second category.

For example, if the first preset proportion threshold is set to be 50% and the second preset proportion threshold is set to be 70%, in response to that the proportion of the first category is greater than 50% and less than 70%, it indicates that the first category takes a higher proportion in the input LLR array; accordingly, the second category takes a lower proportion in the input LLR array. Then, it is determined that the first category has a weight far greater than that of the second category so that the first category corresponds to a large enough weight and the second category corresponds to a less enough weight, which is beneficial to subsequent data quantization.

In some implementations, the determining a weight of each category according to the proportion of each category and a preset proportion threshold includes: determining, in response to that the classification result includes a high value category, a medium value category and a low value category, and a first proportion is less than a first preset proportion threshold, a second proportion is less than a second preset proportion threshold, and a third proportion is less than a third preset proportion threshold, that weights of categories from low to high in sequence include a weight of the high value category, a weight of the medium value category, and a weight of the low value category; and determining, in response to that the first proportion is greater than or equal to the first preset proportion threshold, that the high value category has a weight greater than that of the medium value category, and greater than that of the low value category; the first proportion is a proportion of the high value category in all categories, the second proportion is a proportion of the low value category in the medium value category and the low value category, and the third proportion is a proportion of the medium value category in the medium value category and the low value category.

For example, if the first preset proportion threshold is set to be 10%, the second preset proportion threshold is set to be 70%, and the third preset proportion threshold is set to be 30%, in response to that the first proportion is less than 10%, the second proportion is less than 70%, and the third proportion is less than 30%, it may be obtained that the low value category corresponds to a weight $p_l = 0.8 + 0.2 * r_l$, the medium value category corresponds to a weight $p_m = 0.2 - 0.2 * r_l$, and the high value category corresponds to a weight $p_h = 0.0$. Therefore, the weight corresponding to the high value category is zero, and the low value category has a greater weight than the medium value category. As a result, according to the weights corresponding to the categories, the LLR elements corresponding to the high value category can be filtered out to reduce an influence of the LLR elements corresponding to the high value category on decoding, thereby improving the decoding accuracy.

It should be noted that, during selecting the weight, a greater weight is assigned to the category including the LLR element with a lower value, because for a typical LDPC iterative decoding algorithm, each time iterative calculation is performed on the check node, the low value category of LLR elements often have a greater influence on the decoded result, and the LLR elements in the low value category can be more accurately scaled in a case where a weight assignment manner biased to the low value category is employed. Moreover, the high value category is scaled with the scale factor, and then is quantized, which often leads to saturated quantization values, but the saturated quantization values of the high value category has less and negligible influence on the decoded result, thereby the decoding accuracy is improved.

At operation 140, scaling the LLR elements according to the scale factor.

For example, each LLR element in the input LLR array is multiplied by the scale factor to scale each LLR element and generate a scaled LLR element.

In the data processing method described above, by classifying the LLR elements according to the modulation mode, the preset decoder quantization threshold, and the signal-to-noise ratio, different classification results can be determined according to different modulation modes, different signal-to-noise ratio environments, and different distributions of the LLR elements, so as to meet the requirements of fading channels and different throughput levels in a 5G system on quantization of the LLR elements. In the procedure of classifying, the LLR elements may be balanced according to the categories in the classification result, and feature information of each category in the classification result is extracted, the scale factor is calculated according to the feature information of each category, the LLR elements are scaled according to the scale factor to obtain the scaled LLR elements, which can effectively reduce quantization errors of key LLR elements, improve the decoding accuracy of LDPC decoding, and reduce the complexity of scaling calculation.

In an implementation, before the operation 110, the method further includes operations 150 and 160.

At operation 150, limiting each LLR element to obtain a limited LLR element.

It should be noted that limiting refers to an operation of limiting all instantaneous values of a characteristic (e.g., voltage, current, power) of a signal exceeding a preset threshold to the preset threshold, while reserving all other instantaneous values. For example, a part of the LLR elements in the range of [−128.0, 128.0] are reserved, while other values beyond that range are reduced to approximate the range, so as to ensure that the feature information of the LLR elements is more prominent.

At operation 160, caching the limited LLR element into a cache region.

For example, limited LLR elements are saved in a preset memory cache region or a preset storage device. The above caching methods are merely examples, and other caching methods not described herein are also within the protection scope of the present application and may be specifically set according to specific situations, and thus are not repeated here.

In the data processing method described above, each LLR element is firstly limited to obtain the limited LLR element, so that the feature information of the LLR elements is more prominent. Then, the limited LLR element is cached into the cache region to ensure integrity of the LLR elements in the LLR array. Next, by classifying the LLR elements according to the modulation mode, the preset decoder quantization threshold, and the signal-to-noise ratio, different classification results can be determined for different modulation modes, different signal-to-noise ratio environments, and different distributions of the LLR elements, so as to meet the requirements of fading channels and different throughput levels in a 5G system on quantization of the LLR elements. In the procedure of classifying, the LLR elements may be balanced according to the categories in the classification result, and the feature information of each category in the classification result is extracted, the scale factor is calculated according to the feature information of each category, the LLR elements are scaled according to the scale factor to obtain the scaled LLR elements, which can effectively reduce quantization errors of key LLR elements, improve the decoding accuracy of LDPC decoding, and reduce the complexity of scaling calculation.

Figure 2:
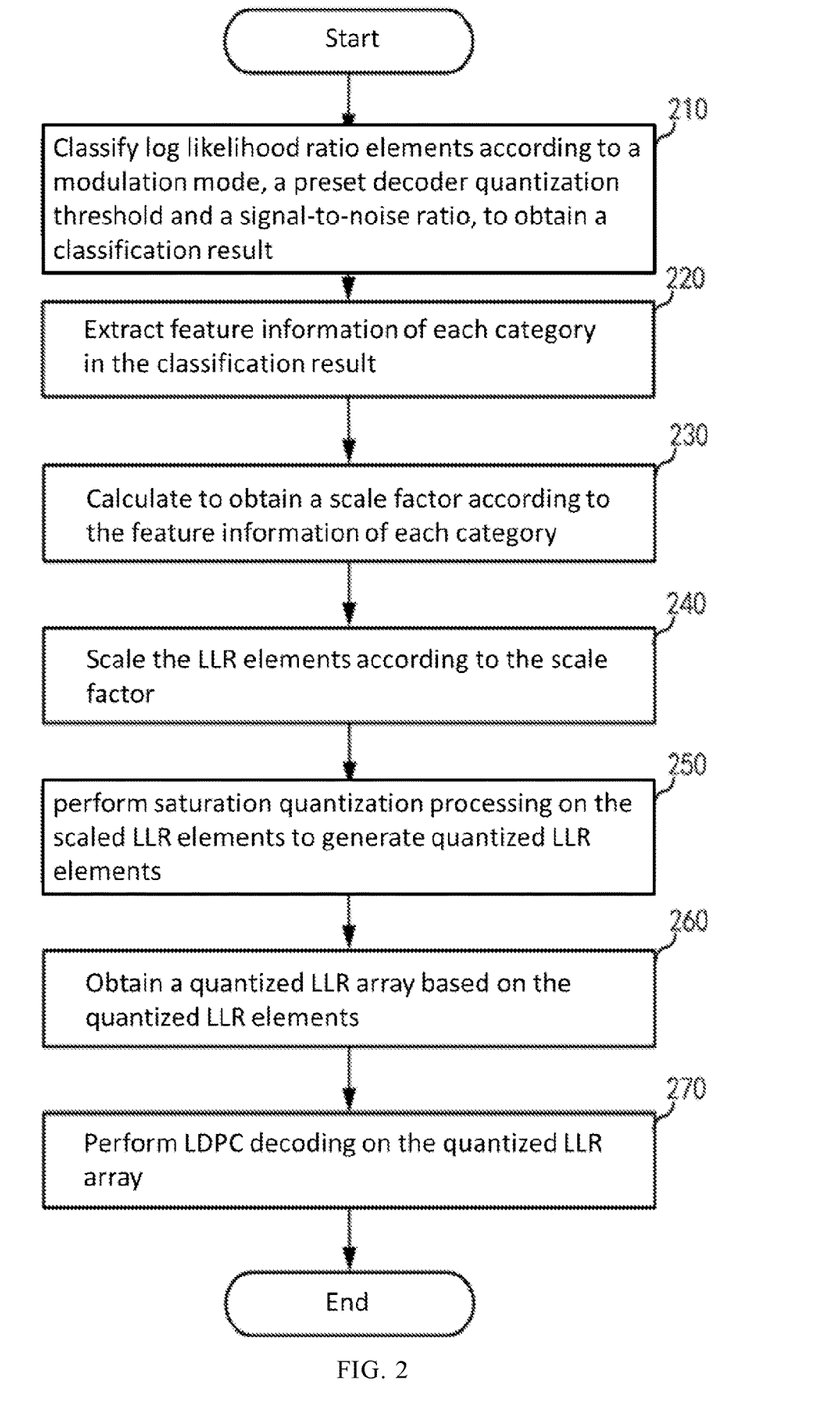
FIG. 2 is a flowchart of a data processing method according to the present application.

FIG. 2 shows another schematic flowchart of a data processing method according to the present application. The data processing method may be applied to a data processing device that may be disposed in a decoder. As shown in FIG. 2, the data processing method according to the present application includes the following operations 210 to 270.

At operation 210, classifying log likelihood ratio elements according to a modulation mode, a preset decoder quantization threshold and a signal-to-noise ratio, to obtain a classification result.

At operation 220, extracting feature information of each category in the classification result.

At operation 230, calculating to obtain a scale factor according to the feature information of each category.

At operation 240, scaling the LLR elements according to the scale factor.

It should be noted that operations 210 to 240 are the same as operations 110 to 140 described above, and thus are not repeated here.

At operation 250, performing saturation quantization processing on the scaled LLR elements to generate quantized LLR elements.

For example, the scaled LLR elements are processed within a preset quantization range (e.g., a preset quantization range of [−8.0, 7.75] with a quantization step of 0.25). That is, the scaled LLR elements are quantized according to the quantization step, and the quantization range is [−8.0, 7.75], so that values of the quantized LLR elements do not exceed the preset quantization range, thereby facilitating subsequent processing on the quantized LLR elements At operation 260, obtaining a quantized LLR array based on the quantized LLR elements.

For example, if there are K LLR elements before quantization, the quantized LLR array includes K quantized LLR elements, where K is an integer greater than or equal to 1.

At operation 270, performing low density parity check code decoding on the quantized LLR array.

It should be noted that the low density parity check code decoding is an error correction/detection technique used in various communication systems or information storage systems, which has performances approaching the channel limit and can ensure correctness of the decoded result.

In the data processing method described above, by classifying the LLR elements according to the modulation mode, the preset decoder quantization threshold, and the signal-to-noise ratio, different classification results can be determined for different modulation modes, different signal-to-noise ratio environments, and different distributions of the LLR elements, so as to meet the requirements of fading channels and different throughput levels in a 5G system on quantization of the LLR elements. Further, the LLR elements may be balanced according to the categories in the classification result, feature information of each category in the classification result is extracted, the scale factor is calculated according to the feature information of each category, and the LLR elements are scaled according to the scale factor to obtain scaled LLR elements. By performing saturation quantization processing on the scaled LLR elements to generate quantized LLR elements, quantization errors of key LLR elements are effectively reduced; and by performing low density parity check code decoding on the quantized LLR array, the decoding accuracy of LDPC decoding is improved, and the complexity of scaling calculation is reduced.

Figure 3:
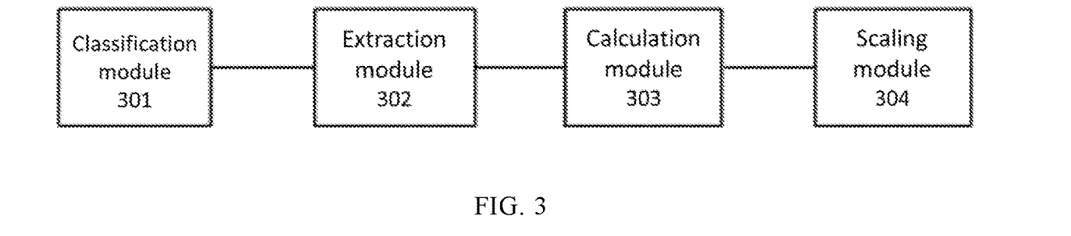
FIG. 3 is a block diagram of a data processing device according to the present application.

A data processing device according to the present application will be described in detail below with reference to the accompanying drawings. FIG. 3 shows a block diagram of the data processing device according to the present application. As shown in FIG. 3, the data processing device includes: a classification module 301 configured to classify LLR elements according to a modulation mode, a preset decoder quantization threshold and a signal-to-noise ratio, to obtain a classification result; an extraction module 302 configured to extract feature information of each category in the classification result; a calculation module 303 configured to calculate to obtain a scale factor according to the feature information of each category; and a scaling module 304 configured to scale the LLR elements according to the scale factor.

According to the data processing device in the present application, the classification module classifies the LLR elements according to the modulation mode, the preset decoder quantization threshold, and the signal-to-noise ratio, so that different classification results can be determined for different modulation modes, different signal-to-noise ratio environments, and different distributions of the LLR elements, the requirements of fading channels and different throughput levels in a 5G system on quantization of the LLR elements are met. In the procedure of classifying, the LLR elements may be balanced according to the categories in the classification result, and the extraction module extracts feature information of each category in the classification result, the calculation module calculates the scale factor according to the feature information of each category, and then the scaling module scales the LLR elements according to the scale factor to obtain scaled LLR elements. Therefore, quantization errors of key LLR elements can be effectively reduced, the decoding accuracy of LDPC decoding is improved, and the complexity of scaling calculation can be reduced.

Figure 4:
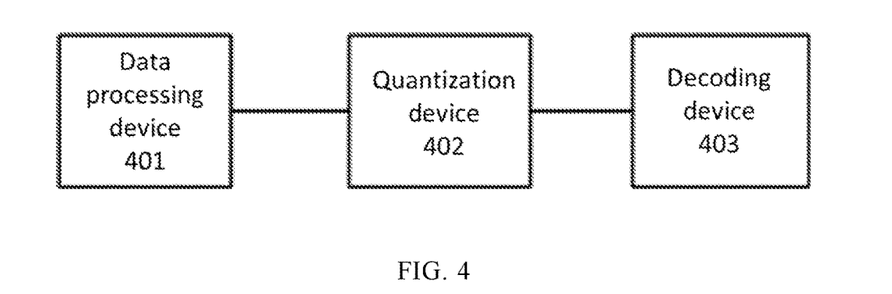
FIG. 4 is a block diagram of a decoder according to the present application.

FIG. 4 shows a block diagram of a decoder according to the present application. As shown in FIG. 4, the decoder includes: a data processing device 401 configured to execute the data processing method described above to generate scaled LLR elements; a quantization device 402 configured to perform saturation quantization processing on the scaled LLR elements output from the data processing device to generate quantized LLR elements, and obtain a quantized LLR array based on the quantized LLR elements; and a decoding device 403 configured to perform low density parity check code decoding on the quantized LLR array.

According to the decoder in the present application, different classification results can be determined for different modulation modes, different signal-to-noise ratio environments, and different distributions of the LLR elements through the data processing device, so as to meet the requirements of fading channels and different throughput levels in a 5G system on quantization of the LLR elements. In the procedure of classifying, the LLR elements may be balanced according to the categories in the classification result, and feature information of each category in the classification result is extracted, so as to calculate the scale factor according to the feature information of each category, then, the LLR elements are scaled according to the scale factor to obtain the scaled LLR elements to be output to the quantization device, and the quantization device performs saturation quantization processing on the scaled LLR elements to generate quantized LLR elements, which can effectively reduce quantization errors of key LLR elements, and next, the decoding device is configured to perform low density parity check code decoding on the quantized LLR array, so as to improve the decoding accuracy of LDPC decoding, and reduce the complexity of scaling calculation.

It should be noted that the present application is not limited to the particular configurations and processes described above and illustrated in the drawings. For convenience and simplicity of description, detailed description of any known method is omitted here, and for the specific operations of the system, the module and the unit described above, reference may be made to corresponding processes in the foregoing method, which are not repeated here.

Figure 5:
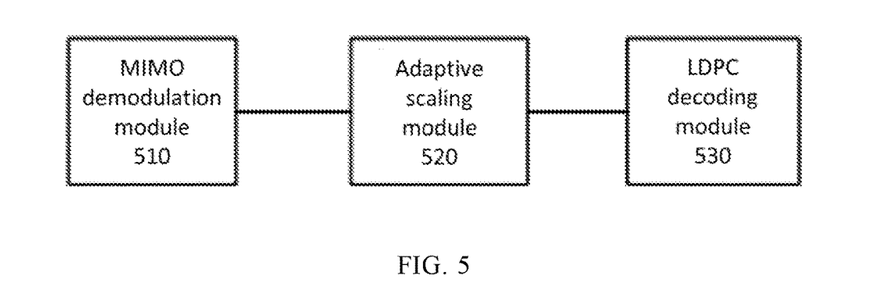
FIG. 5 is a block diagram of a data processing system according to the present application.

FIG. 5 shows a block diagram of a data processing system according to the present application. As shown in FIG. 5, the data processing system includes: a multiple input multiple output (MIMO) demodulation module 510, an adaptive scaling module 520, and an LDPC decoding module 530.

The MIMO demodulation module 510 is configured to generate LLR elements, and the adaptive scaling module 520 is configured to scale LLR elements in an LLR array input from the MIMO demodulation module 510 to obtain scaled LLR elements; and the LDPC decoding module 530 is configured to decode the scaled LLR elements output from the adaptive scaling module 520.

Figure 6:
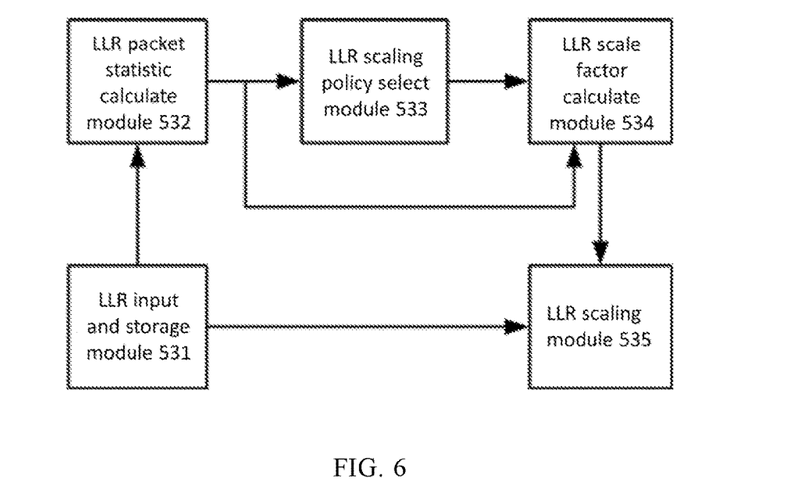
FIG. 6 is a block diagram of an adaptive scaling module according to the present application.

FIG. 6 shows a block diagram of an adaptive scaling module 530 according to the present application. As shown in FIG. 6, the adaptive scaling module 530 includes: an LLR input and storage module 531, an LLR packet statistic calculate module 532, an LLR scaling policy select module 533, an LLR scale factor calculate module 534, and an LLR scaling module 535.

The LLR input and storage module 531 is configured to store LLR elements in the input LLR array.

The LLR packet statistic calculate module 532 is configured to sequentially read values of the stored LLR elements from the LLR input and storage module 531; calculate a classification threshold in an adaptive manner according to a modulation mode, an SNR and a preset decoder quantization threshold, and classify the LLR elements according to the classification threshold to obtain a classification result; count a number of LLR elements in each category to obtain a number statistical result corresponding to each category; accumulate values of the LLR elements in each category to generate a numerical value statistical result corresponding to each category; calculate and generate an LLR mean value corresponding to each category according to the numerical value statistical result corresponding to each category and the number statistical result corresponding to each category; and then, output the number statistical result corresponding to each category to the LLR scaling policy select module 533, and output the LLR mean value corresponding to each category to the LLR scale factor calculate module 534. The LLR packet statistic calculate module 532 is further configured to determine a proportion of each category according to the number statistical result, and output the proportion of each category to the LLR scaling policy select module 533.

The LLR scaling policy select module 533 is configured to calculate, according to the proportion of each category input from the LLR packet statistic calculate module 532, a weight of each category by using a preset comparison policy, and output the weight of each category to the LLR scale factor calculate module 534.

The LLR scale factor calculate module 534 is configured to calculate a scale factor according to the LLR mean value corresponding to each category output from the LLR packet statistic calculate module 532, the weight and a preset target value of each category output from the LLR scaling policy select module 533, and output the scale factor to the LLR scaling module 535.

The LLR scaling module 535 is configured to sequentially multiply the LLR elements stored in the LLR input and storage module 531 by the scale factor according to the scale factor output from the LLR scale factor calculate module 534 to obtain scaled LLR elements, and then output the scaled LLR elements to the LDPC decoding module 530 for decoding.

Figure 7:
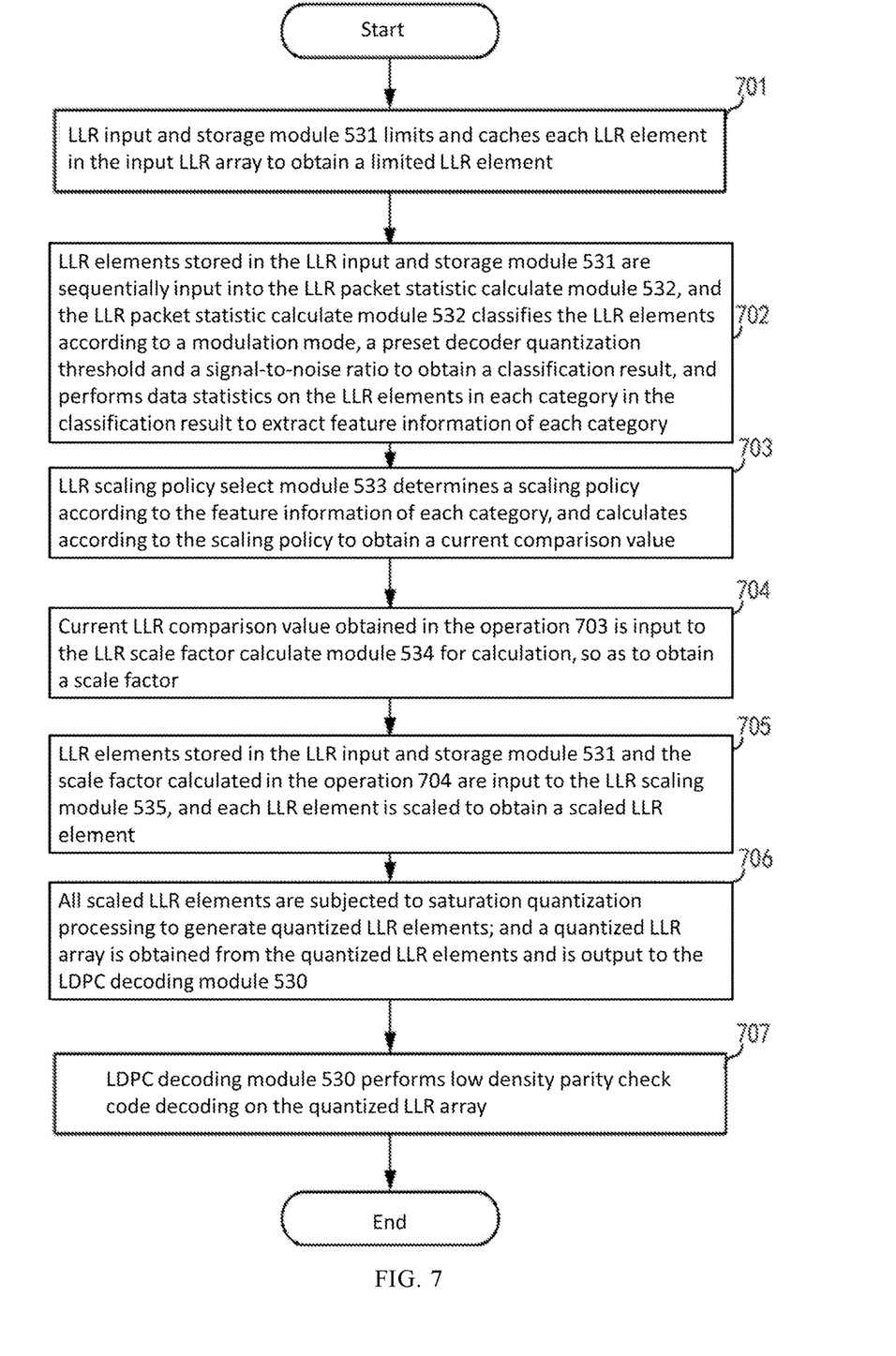
FIG. 7 is a flowchart of a data processing method for processing LLR elements in an input LLR array in a data processing system according to the present application.

FIG. 7 shows a flowchart of a data processing method for processing LLR elements in an input LLR array in a data processing system according to the present application. In a case where the signal-to-noise ratio in the data processing system is 30 dB and the modulation mode is 256QAM, as shown in FIG. 7, the data processing method includes the following operations 701 to 707. The number of the LLR elements included in the LLR array is $num_{all}=49920$.

At operation 701, the LLR input and storage module 531 limits each LLR element in the input LLR array to obtain a limited LLR element and caches the limited LLR element.

As an example, the limited range is [−128.0, 128.0]. For example, the limited LLR element $LLR_{in}[i]$ may be calculated by the following equation (1), where i is an integer taking a value in a range from 0 to $num_{all}-1$.

$$LLR_{in}[i] = \begin{cases} -128.0 & LLR[i] \leq -128.0 \\ LLR[i] & -12.80 < LLR[i] < 128.0, \\ 128.0 & LLR[i] \geq 128.0 \end{cases} \quad (1)$$

where $LLR_{in}[i] \in [-128.0, 128.0]$. It should be noted that limiting refers to an operation of limiting all instantaneous values of a characteristic (e.g., voltage, current, power) of a signal exceeding a preset threshold to the preset threshold, and reserving all other instantaneous values. For example, a part of the LLR elements in the range of [−128.0, 128.0] are reserved, while other values beyond that range are reduced to approximate the range.

At operation 702, the LLR elements stored in the LLR input and storage module 531 are sequentially input into the LLR packet statistic calculate module 532, and the LLR packet statistic calculate module 532 classifies the LLR elements according to a modulation mode, a preset decoder quantization threshold and a signal-to-noise ratio to obtain a classification result, and performs data statistics on the LLR elements in each category in the classification result to extract feature information of each category.

First, according to a maximum absolute value of the quantization range of the current LDPC decoder, calculation is performed based on the current modulation mode and the current signal-to-noise ratio to obtain a classification threshold $Th_{LLR} = Factor_{qam} * Factor_{SNR} * q_{abs}$, where $q_{abs}$ represents the preset decoder quantization threshold, $Factor_{qam}$ represents a classification threshold calculation factor corresponding to the modulation mode, and $Factor_{SNR}$ represents a classification threshold calculation factor corresponding to the signal-to-noise ratio. Table 1 shows classification threshold calculation factors corresponding to typical modulation modes.

TABLE 1

Classification threshold calculation factors corresponding to modulation modes

| Modulation mode | Classification threshold calculation factor |
| --- | --- |
| QPSK | 3.0 |
| 16 QAM | 3.5 |
| 64 QAM | 4.0 |
| 256 QAM | 4.0 |

For example, if the quantization range of the LDPC decoder is [−a, b], and a and b are both numbers greater than zero, then the preset decoder quantization threshold $q_{abs} = \max(a, b)$. For example, if [−a, b]=[−8.0, 7.75], then $q_{abs}=8$. If the current signal-to-noise ratio is s dB, the classification threshold calculation factor corresponding to the signal-to-noise ratio may be calculated by the following equation (2). Since the data processing system described here adopts the modulation mode of 256QAM, based on the above analysis, the classification threshold may be calculated as:

$$Th_{LLR} = 4.0 \times 0.9 \times 8.0 = 28.8. \quad (2)$$

$$Factor_{SNR} = \begin{cases} 1.0 & s \geq 40 \\ 0.5 + 0.01 * (s + 10) & -10 < s < 40 \\ 0.5 & s \leq -10 \end{cases}$$

Then, the LLR elements in the LLR array are classified, according to the classification threshold $Th_{LLR}=28.8$, for example, into a high value category and a low value category, and feature information of the high value category and feature information of the low value category are extracted, respectively. A value of each LLR element in the high value category is greater than or equal to 28.8; and a value of each LLR element in the low value category is less than 28.8. The number of the LLR elements in the high value category is counted and marked as $num_h$, and values of the LLR elements in the high value category are accumulated to generate a numerical value statistical result $sum_h$. Likewise, the number of the LLR elements in the low value category is counted and marked as $num_l$, and values of the LLR elements in the low value category are accumulated to generate a numerical value statistical result $sum_l$ corresponding to the low value category.

An LLR mean value corresponding to the high value category is calculated as $m_h = sump_h \div num_h$; and an LLR mean value corresponding to the low value category is calculated as $m_l = SUM_l \div num_l$. The feature information of each category is determined according to the number statistical result corresponding to each category, the numerical value statistical result corresponding to each category, and the LLR mean value corresponding to each category, and is output to the LLR scaling policy select module 533.

At operation 703, the LLR scaling policy select module 533 determines a scaling policy according to the feature information of each category, and calculates according to the scaling policy to obtain a current comparison value.

A proportion of the low value category in the input LLR array, that is, a low value proportion $r_l = num_l / num_{all}$ is calculated first. According to the low value proportion, the first preset proportion threshold and the second preset proportion threshold, different scaling policies can be determined, and the weight of each category can be calculated.

For example, if the low value proportion $r_l$ is greater than or equal to the first preset proportion threshold $Th_l^1$, a first scaling policy is obtained, and it is calculated that the low value category corresponds to a weight $p_l=1.0$, and the high value category corresponds to a weight $p_h=0.0$.

If the low value proportion $r_l$ is less than or equal to the second preset proportion threshold $Th_l^2$, a second scaling policy is obtained, and it is calculated that the low value category corresponds to a weight $p_l=0.0$, and the high value category corresponds to a weight $p_h=1.0$.

If the low value proportion $r_l$ is greater than the second preset proportion threshold $Th_l^2$, and less than the first preset proportion threshold $Th_l^1$, a third scaling policy is obtained, and it is calculated that the low value category corresponds to a weight $p_l=0.9+0.1*r_l$, and the high value category corresponds to a weight $p_h=0.1-0.1*r_l$, where 0.9 and 0.1 are values obtained from a simulation result, which ensures that the low value category corresponds to a higher weight and the high value category corresponds to a lower weight, and thus is beneficial to subsequent data quantization. Table 2 shows typical values of the first preset proportion threshold and the second preset proportion threshold corresponding to the modulation modes in the present application.

TABLE 2

Correspondence between preset proportion
thresholds and modulation modes

| Modulation mode | First preset proportion threshold | Second preset proportion threshold |
|---|---|---|
| QPSK | 0.8 | 0.1 |
| 16 QAM | 0.4 | 0.1 |
| 64 QAM | 0.1 | 0.05 |
| 256 QAM | 0.1 | 0.05 |

Then, according to the calculated weight corresponding to each category, the current comparison value is calculated as $LLR_{mean}=p_l*m_l+p_h*m_h$.

At operation 704, the current LLR comparison value obtained in operation 703 is input to the LLR scale factor calculate module 534 for calculation, so as to obtain a scale factor.

For example, the scale factor is calculated by the following equation (3), where $Factor_{scaling}$ represents the scale factor; $LLR_{target}$ represents a preset target value, which is a value determined according to $q_{abs}$ and calculation factors $Factor_{target}$ corresponding to different modulation modes, i.e., a value calculated from the following equation (4). Table 3 shows correspondence between the modulation modes in the present application and the calculation factors $Factor_{target}$ corresponding to the modulation modes.

$$Factor_{scaling}=LLR_{target} \div LLR_{mean} \quad (3)$$

$$LLR_{target}=q_{abs}*Factor_{target} \quad (4)$$

TABLE 3

Modulation modes and corresponding
calculation factors

| Modulation mode | Calculation factor corresponding to the modulation mode |
|---|---|
| QPSK | 0.5 |
| 16 QAM | 0.6 |
| 64 QAM | 0.75 |
| 256 QAM | 0.75 |

Here, if the preset decoder quantization threshold is 8.0 and the modulation mode of 256QAM corresponds to a calculation factor 0.75, then the preset target value is calculated as $LLR_{target}=8.0*0.75=6.0$.

At operation 705, the LLR elements stored in the LLR input and storage module 531 and the scale factor calculated in the operation 704 are input to the LLR scaling module 535, and each LLR element is scaled to obtain a scaled LLR element.

For example, each LLR element is scaled by the following equation (5) to obtain the scaled LLR element, where i is an integer taking a value in a range from 0 to $num_{all}-1$. $LLR_{scaling}[i]$ represents the $i^{th}$ scaled LLR element.

$$LLR_{scaling}[i]=LLR_{in}[i]*Factor_{scaling} \quad (5)$$

At operation 706, all scaled LLR elements are subjected to saturation quantization processing to generate quantized LLR elements; and a quantized LLR array is obtained from the quantized LLR elements and is output to the LDPC decoding module 530.

Here, since the quantization range is [−8.0, 7.75] with a quantization step 0.25, each LLR element is quantized by 6 bits through the following equation (6) to obtain a quantized LLR element $LLR_{quan}[i]$; and a quantized LLR array $LLR_{quan}$ is obtained from all quantized LLR elements, where floor(x) represents a round down function, i.e., taking the largest integer not greater than x.

$$LLR_{quan}[i] = \begin{cases} -32 & LLR_{tmp}[i] \le -32 \\ floor(LLR_{scaling}[i]/0.25) & -32 < LLR_{tmp}[i] < 31 \\ 31 & LLR_{tmp}[i] \ge 31 \end{cases} \quad (6)$$

At operation 707, the LDPC decoding module 530 performs low density parity check code decoding on the quantized LLR array.

For example, LDPC decoding is performed on the quantized LLR array $LLR_{quan}$ to obtain a decoded result.

In the data processing method described above, by classifying the LLR elements according to the modulation mode, the preset decoder quantization threshold, and the signal-to-noise ratio to obtain the high value category and the low value category, different classification results can be determined for different modulation modes, different signal-to-noise ratio environments, and different distributions of the LLR elements, so as to meet the requirements of fading channels and different throughput levels in a 5G system on quantization of the LLR elements. In the procedure of classifying, the LLR elements in the high value category and the LLR elements in the low value category are balanced, and feature information of the high value category and feature information of the low value category are extracted, respectively, the scale factor is calculated based on the feature information of the high value category and the feature information of the low value category, and then, the LLR elements are scaled according to the scale factor to obtain scaled LLR elements. Therefore, quantization errors of key LLR elements can be effectively reduced, the decoding accuracy of LDPC decoding is improved, and the complexity of scaling calculation is reduced.

In an implementation, in a case where the signal-to-noise ratio in the data processing system is 10 dB and the modulation mode is 16QAM, the LLR elements in the input LLR array are processed by the data processing system in a data processing method the same as that shown in FIG. 7. As shown in FIG. 7, the data processing method includes the following operations 701 to 707. The number of the LLR elements included in the LLR array is $num_{all}=49920$.

At operation 701, the LLR input and storage module 531 limits each LLR element in the input LLR array to obtain a limited LLR element, and caches the limited LLR element.

At operation 702, the LLR elements stored in the LLR input and storage module 531 are sequentially input into the LLR packet statistic calculate module 532, and the LLR packet statistic calculate module 532 classifies the LLR elements according to a modulation mode, a preset decoder quantization threshold and a signal-to-noise ratio and performs data statistics on the LLR elements in each category in the classification result to extract feature information of each category.

For example, if the classification threshold includes a first classification threshold $Th_{LLR}^{l-m}$ and a second classification threshold $Th_{LLR}^{m-h}$, the classification result includes a low value category, a medium value category, and a high value category. The first classification threshold represents a classification threshold between the low value category and the medium value category, and the second classification threshold represents a classification threshold between the medium value category and the high value category. The first classification threshold $\text{Th}_{LLR}^{l-m}$ may be calculated from the following equation (7), and The second classification threshold $\text{Th}_{LLR}^{m-h}$ may be calculated from the following equation (8).

$$\text{Th}_{LLR}^{l-m} = \text{Factor}_{LLR}^{l-m} * \text{Factor}_{SNR} * q_{abs} \quad (7)$$

$$\text{Th}_{LLR}^{m-h} = \text{Factor} * \text{Factor}_{SNR} * q_{abs} \quad (8)$$

In above equations, $q_{abs}$ represents the preset decoder quantization threshold, $\text{Factor}_{SNR}$ represents a classification threshold calculation factor corresponding to the signal-to-noise ratio, $\text{Factor}_{LLR}^{l-m}$ represents a first classification threshold calculation factor corresponding to the modulation mode, and $\text{Factor}_{LLR}^{m-h}$ represents a second classification threshold calculation factor corresponding to the modulation mode. Table 4 shows calculation factors of classification thresholds corresponding to typical modulation modes.

TABLE 4

Calculation factors of classification thresholds corresponding to modulation modes

| Modulation mode | First classification threshold calculation factor | Second classification threshold calculation factor |
|---|---|---|
| QPSK | 2.0 | 4.0 |
| 16 QAM | 2.0 | 4.0 |
| 64 QAM | 2.5 | 5.0 |
| 256 QAM | 3.0 | 6.0 |

Here, $q_{abs}=8$; and the signal-to-noise ratio is 10 dB, then it is calculated from the equation (2) that $\text{Factor}_{SNR}=0.7$. Since the modulation mode adopted is 16QAM, it can be known from the Table 4 that the first classification threshold calculation factor is equal to 2.0 and the second classification threshold calculation factor is equal to 4.0, and then it is calculated that the first classification threshold is $\text{Th}_{LLR}^{l-m}=2.0\times 0.7\times 8.0=11.2$ and the second classification threshold is $\text{Th}_{LLR}^{m-h}=4.0\times 0.7\times 8.0=22.4$.

Then, the LLR elements in the LLR array are classified according to the first classification threshold 11.2 and the second classification threshold 22.4 to obtain the low value category, the medium value category and the high value category, and then feature information of the high value category and feature information of the medium value category are extracted, respectively. A value of each LLR element in the low value category is less than 11.2; a value of each LLR element in the medium value category is greater than or equal to 11.2 and less than 22.4; and a value of each LLR element in the high value category is greater than or equal to 22.4. The number of the LLR elements in the high value category is counted and marked as $\text{num}_h$, and values of the LLR elements in the high value category are accumulated to generate a numerical value statistical result $\text{sum}_h$. Likewise, the number of the LLR elements in the medium value category is counted and marked as $\text{num}_m$, and values of the LLR elements in the medium value category are accumulated to generate a numerical value statistical result $\text{sum}_m$ corresponding to the medium values category; and the number of the LLR elements in the low value category is counted and marked as $\text{num}_l$, and values of the LLR elements in the low value category are accumulated to generate a numerical value statistical result $\text{sum}_l$ corresponding to the low value category.

An LLR mean value corresponding to the high value category is calculated as $m_h = \text{sum}_h \div \text{num}_h$; an LLR mean value corresponding to the medium value category is calculated as $m_m = \text{sum}_m \div \text{num}_m$; and an LLR mean value corresponding to the low value category is calculated as $m_l = \text{sum}_l \div \text{num}_l$. The feature information of each category is determined according to the number statistical result corresponding to each category, the numerical value statistical result corresponding to each category, and the LLR mean value corresponding to each category, and is output to the LLR scaling policy select module 533.

At operation 703, the LLR scaling policy select module 533 determines a scaling policy according to the feature information of each category, and calculates according to the scaling policy to obtain a current comparison value.

A proportion of the high value category in the entire input LLR array is calculated, that is, a high value proportion $r_h = \text{num}_h / \text{num}_{all}$; a proportion of the medium value category in the low value category and the medium value category is calculated, that is, a medium value proportion $r_m = \text{num}_m / (\text{num}_{all} - \text{num}_h)$; and a proportion of the low value category in the low value category and the medium value category is calculated, that is, a low value proportion $r_l = \text{num}_l / (\text{num}_{all} - \text{num}_h)$. According to the low value proportion $r_l$, the medium value proportion $r_m$, the high value proportion $r_h$, the first preset proportion threshold $\text{Th}_h$, the second preset proportion threshold $\text{Th}_m$ and the third preset proportion threshold $\text{Th}_l$, different scaling policies can be determined, and the weight of each category can be calculated.

For example, if the high value proportion $r_h$ is greater than or equal to the first preset proportion threshold $\text{Th}_h$, it indicates that no noise is present in the system and a first scaling policy is obtained, and it is calculated that the low value category corresponds to a weight $p_l=0.0$, the medium value category corresponds to a weight $p_m=0.0$, and the high value category corresponds to a weight $p_h=1.0$.

If the high value proportion $r_h$ is less than the first preset proportion threshold $\text{Th}_h$, and the low value proportion $r_l$ is greater than or equal to the third preset proportion threshold $\text{Th}_l$, a second scaling policy is obtained, and it is calculated that the low value category corresponds to a weight $p_l=1.0$, the medium value category corresponds to a weight $p_m=0.0$, and the high value category corresponds to a weight $p_h=0.0$.

If the high value proportion $r_h$ is less than the first preset proportion threshold $\text{Th}_h$, and the medium value proportion $r_m$ is greater than or equal to the second preset proportion threshold $\text{Th}_m$, a third scaling policy is obtained, and it is calculated that the low value category corresponds to a weight $p_l=0.0$, the medium value category corresponds to a weight $p_m=1.0$, and the high value category corresponds to a weight $p_h=0.0$.

If the high value proportion $r_h$ is less than the first preset proportion threshold $\text{Th}_h$, and the low value proportion $r_l$ is less than the third preset proportion threshold $\text{Th}_l$, and the medium value proportion $r_m$ is less than the second preset proportion threshold $\text{Th}_m$, a fourth scaling policy is obtained, and it is calculated that the low value category corresponds to a weight $p_l=0.8+0.2*r_l$, the medium value category corresponds to a weight $p_m=0.2-0.2*r_l$, and the high value category corresponds to a weight $p_h=0.0$. Table 5 shows typical values of the preset proportion thresholds corresponding to the modulation modes in the present application.

TABLE 5

Modulation modes and corresponding preset proportion thresholds

| Modulation mode | First proportion threshold | Second proportion threshold | Third proportion threshold |
|---|---|---|---|
| QPSK | 0.8 | 0.75 | 0.9 |
| 16 QAM | 0.6 | 0.75 | 0.9 |
| 64 QAM | 0.5 | 0.85 | 0.95 |
| 256 QAM | 0.5 | 0.85 | 0.95 |

Then, according to the calculated weight corresponding to each category, the current comparison value is calculated as $LLR_{mean}=p_l*m_l+p_m*m_m+p_h*m_h$.

At operation 704, the current LLR comparison value obtained in the operation 703 is input to the LLR scale factor calculate module 534 for calculation, so as to obtain a scale factor.

The scale factor may be calculated from the above equation (3) and equation (4). Here, a maximum absolute value of the quantization range is 8.0, and the modulation mode adopted is 16QAM. It can be obtained from the Table 4 that in a case where the modulation mode 16QAM corresponds to the calculation factor 0.6, the preset target value is calculated as $LLR_{target}=8.0*0.6=4.8$.

At operation 705, the LLR elements stored in the LLR input and storage module 531 and the scale factor calculated in the operation 704 are input to the LLR scaling module 535, and each LLR element is scaled to obtain a scaled LLR element.

At operation 706, all scaled LLR elements are subjected to saturation quantization processing to generate quantized LLR elements; and a quantized LLR array is obtained from the quantized LLR elements and is output to the LDPC decoding module 530.

At operation 707, the LDPC decoding module 530 performs low density parity check code decoding on the quantized LLR array.

In the data processing method described above, by classifying the LLR elements according to the modulation mode, the preset decoder quantization threshold, and the signal-to-noise ratio to obtain the high value category, the medium value category, and the low value category, different classification results can be determined for different modulation modes, different signal-to-noise ratio environments, and different distributions of the LLR elements, so as to meet the requirements of fading channels and different throughput levels in a 5G system on quantization of the LLR elements. In the procedure of classifying, the LLR elements in the high value category, the medium value category and the LLR elements in the low value category are balanced, and feature information of the high value category, the medium value category and the low value category are extracted, respectively, the scale factor is calculated based on the feature information of the high value category, the medium value category and the low value category, and then, the LLR elements are scaled according to the scale factor to obtain scaled LLR elements. Therefore, quantization errors of key LLR elements can be effectively reduced, the decoding accuracy of LDPC decoding is improved, and the complexity of scaling calculation is reduced.

Figure 8:
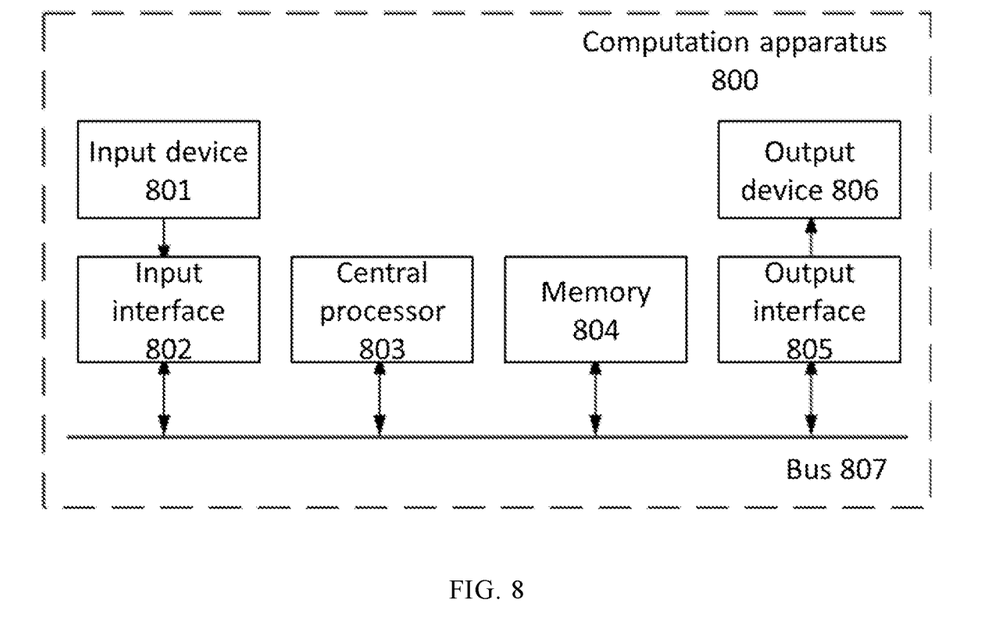
FIG. 8 is a structural diagram of an exemplary hardware architecture of a computation apparatus for implementing a data processing method and a data processing device according to the present application.

FIG. 8 shows a structural diagram of an exemplary hardware architecture of a computation apparatus for implementing the data processing method and the data processing device according to the present application.

As shown in FIG. 8, the computation apparatus 800 includes an input device 801, an input interface 802, a central processor 803, a memory 804, an output interface 805, and an output device 806. The input interface 802, the central processor 803, the memory 804, and the output interface 805 are interconnected via a bus 807, and the input device 801 and the output device 806 are connected to the bus 807 via the input interface 802 and the output interface 805, respectively, and further connected to other components of the computation apparatus 800.

Specifically, the input device 801 receives input information from outside, and transmits the input information to the central processor 803 via the input interface 802; the central processor 803 processes the input information based on computer-executable instructions stored in the memory 804 to generate output information, stores the output information temporarily or permanently in the memory 804, and then transmits the output information to the output device 806 via the output interface 805; and the output device 806 outputs the output information to the outside of the computation apparatus 800 to be used by a user.

In some implementations, the computation apparatus shown in FIG. 8 may be implemented as a network device that includes: a memory configured to store a program; a processor configured to execute the program stored in the memory to perform the data processing method described above.

In some implementations, the computation apparatus shown in FIG. 8 may be implemented as a data processing system that includes: a memory configured to store a program; a processor configured to execute the program stored in the memory to perform the data processing method described above.

The above are only exemplary implementations of the present application and not intended to limit the scope of the present application. In general, the various implementations of the present application may be implemented in hardware or dedicated circuits, software, logic or any combination thereof. For example, some aspects may be implemented in hardware, while other aspects may be implemented in firmware or software which may be executed by a controller, microprocessor or other computing device, although the present application is not limited thereto.

The implementations of the present application may be implemented by a data processor of a mobile device executing computer program instructions, for example in a processor entity, or by hardware, or by a combination of software and hardware. The computer program instructions may be assembler instructions, instruction set architecture (ISA) instructions, machine instructions, machine-related instructions, microcode, firmware instructions, state setting data, or source code or object code written in any combination of one or more programming languages.

It should be understood that in the present application, the memory may be a non-transitory computer-readable storage medium on which the computer program instructions/programs may be stored.

The block diagrams of any logic flow in the figures of the present application may represent program operations, or may represent interconnected logic circuits, modules, and functions, or may represent a combination of program operations and logic circuits, modules, and functions. The computer program may be stored on a memory. The memory may be of any type suitable to the local technical environment and may be implemented using any suitable data storage technology, such as but not limited to, read-only memories (ROMs), random access memories (RAMs), optical storage devices or systems (digital versatile discs (DVDs), compact discs (CDs)), etc. The computer-readable storage medium may include a non-transitory storage medium. The data processor may be of any type suitable to the local technical environment, such as but not limited to, general purpose computers, dedicated computers, microprocessors, digital signal processors (DSPs), application specific integrated circuits (ASICs), field-programmable gate arrays (FGPAs), and processors based on multi-core processor architecture.

The foregoing has provided by way of exemplary and non-limiting examples a detailed description of exemplary implementations of the present application. Various modifications and adaptations to the foregoing implementations may become apparent to those skilled in the art in view of the accompanying drawings and the appended claims, without departing from the scope of the present application. Accordingly, the proper scope of the present application is to be determined according to the claims.

What is claimed is:

1. A data processing method, comprising:
classifying log likelihood ratio (LLR) elements according to a modulation mode, a preset decoder quantization threshold and a signal-to-noise ratio, to obtain a classification result;
extracting feature information of each category in the classification result;
calculating to obtain a scale factor according to the feature information of each category; and
scaling the LLR elements according to the scale factor.

2. The method according to claim 1, wherein the classifying log likelihood ratio (LLR) elements according to a modulation mode, a preset decoder quantization threshold and a signal-to-noise ratio, to obtain a classification result comprises:
generating a classification threshold according to the modulation mode, the preset decoder quantization threshold and the signal-to-noise ratio;
determining a category corresponding to each LLR element according to the classification threshold and a value of the LLR element; and
obtaining the classification result based on the category corresponding to each LLR element.

3. The method according to claim 1, wherein the extracting feature information of each category in the classification result comprises performing following operations on each category in the classification result:
counting a number of LLR elements in each category to obtain a number statistical result corresponding to each category;
accumulating values of the LLR elements in each category to generate a numerical value statistical result corresponding to each category;
calculating and generating an LLR mean value corresponding to each category according to the numerical value statistical result corresponding to each category and the number statistical result corresponding to each category; and
determining the feature information of each category according to the number statistical result corresponding to each category, the numerical value statistical result corresponding to each category, and the LLR mean value corresponding to each category.

4. The method according to claim 3, wherein the calculating to obtain a scale factor according to the feature information of each category comprises:
determining a proportion of each category according to the number statistical result;
determining a weight of each category according to a proportion of each category and a preset proportion threshold; and
calculating to obtain the scale factor according to the weight of each category, the LLR mean value corresponding to each category and a preset target value, wherein the preset target value is a value determined according to the preset decoder quantization threshold and the modulation mode.

5. The method according to claim 4, wherein the determining a weight of each category according to a proportion of each category and a preset proportion threshold comprises:
in response to determining that the classification result comprises a first category and a second category, and the first category has a proportion greater than a first preset proportion threshold and less than a second preset proportion threshold, a value of each LLR element in the first category is less than a preset element threshold, and a value of each LLR element in the second category is greater than the preset element threshold, determining that the first category has a greater weight than the second category.

6. The method according to claim 4, wherein the determining a weight of each category according to a proportion of each category and a preset proportion threshold comprises:
in response to determining that the classification result comprises a high value category, a medium value category and a low value category, and a first proportion is less than a first preset proportion threshold, a second proportion is less than a second preset proportion threshold, and a third proportion is less than a third preset proportion threshold, determining that weights of categories from low to high in sequence comprise a weight of the high value category, a weight of the medium value category, and a weight of the low value category; and
determining, in response to that the first proportion is greater than or equal to the first preset proportion threshold, that the high value category has a weight greater than that of the medium value category, and greater than that of the low value category,
wherein the first proportion is a proportion of the high value category in all categories, the second proportion is a proportion of the low value category in the medium value category and the low value category, and the third proportion is a proportion of the medium value category in the medium value category and the low value category.

7. The method according to claim 1, further comprising:
before classifying the log likelihood ratio (LLR) elements according to the modulation mode, the preset decoder quantization threshold and the signal-to-noise ratio, to obtain the classification result, limiting each LLR element to obtain a limited LLR element; and
caching the limited LLR element into a cache region.

8. The method according to claim 1, further comprising:
after scaling the LLR elements according to the scale factor, performing saturation quantization processing on the scaled LLR elements to generate quantized LLR elements;

obtaining a quantized LLR array based on the quantized LLR elements; and performing low density parity check code decoding on the quantized LLR array.

9. A decoder, comprising:

a data processing device configured to perform the data processing method according to claim 1 to generate scaled LLR elements;

a quantization device configured to perform saturation quantization processing on the scaled LLR elements output from the data processing device to generate quantized LLR elements, and obtain a quantized LLR array based on the quantized LLR elements; and a decoding device configured to perform low density parity check code decoding on the quantized LLR array.

10. A network device, comprising:

at least one processor;

a memory having at least one program stored thereon, the at least one program, when executed by the at least one processor, causes the at least one processor to implement the data processing method according to claim 1.

11. A computer-readable storage medium having a computer program stored thereon, the computer program, when executed by a processor, causes the processor to implement the data processing method according to claim 1.

12. A data processing device, comprising:

a classification module configured to classify log likelihood ratio (LLR) elements according to a modulation mode, a preset decoder quantization threshold and a signal-to-noise ratio, to obtain a classification result;

an extraction module configured to extract feature information of each category in the classification result;

a calculation module configured to calculate to obtain a scale factor according to the feature information of each category; and a scaling module configured to scale the LLR elements according to the scale factor.

* * * * *

UNITED STATES PATENT AND TRADEMARK OFFICE
CERTIFICATE OF CORRECTION

PATENT NO. : 12,113,546 B2
APPLICATION NO. : 18/021037
DATED : October 8, 2024
INVENTOR(S) : Qing Bian Page 1 of 1

It is certified that error appears in the above-identified patent and that said Letters Patent is hereby corrected as shown below:

In the Specification

Column 15, Line 9, the formula reading --$TH_{LLR}^{m-h}=Factor*Factor_{SNR}*q_{abs}$-- should read --$Th_{LLR}^{m-h} = Factor_{LLR}^{m-h} * Factor_{SNR} * q_{abs}$--

Signed and Sealed this
Thirteenth Day of May, 2025

Coke Morgan Stewart
*Acting Director of the United States Patent and Trademark Office*